(12) United States Patent
Smith

(10) Patent No.: US 8,138,831 B2
(45) Date of Patent: Mar. 20, 2012

(54) LOW NOISE AMPLIFIER

(75) Inventor: David E Smith, Vancouver, WA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 78 days.

(21) Appl. No.: 12/789,665

(22) Filed: May 28, 2010

(65) Prior Publication Data

US 2011/0291763 A1 Dec. 1, 2011

(51) Int. Cl.
H03G 3/20 (2006.01)

(52) U.S. Cl. .......................................... 330/140; 330/279

(58) Field of Classification Search .................. 330/140, 330/279, 310, 150, 98
See application file for complete search history.

(56) References Cited

U.S. PATENT DOCUMENTS

| | | | | |
|---|---|---|---|---|
| 5,043,672 A | * | 8/1991 | Youn | 330/129 |
| 5,159,283 A | * | 10/1992 | Jensen | 330/129 |
| 5,220,290 A | * | 6/1993 | Black | 330/279 |
| 5,589,796 A | * | 12/1996 | Alberth et al. | 330/133 |
| 6,128,477 A | * | 10/2000 | Freed | 455/115.1 |
| 7,042,285 B2 | * | 5/2006 | Parkhurst et al. | 330/140 |
| 7,250,818 B2 | * | 7/2007 | Ayun et al. | 330/140 |
| 2003/0006839 A1 | * | 1/2003 | Chominski | 330/140 |

FOREIGN PATENT DOCUMENTS

CN 200969566 10/2007

OTHER PUBLICATIONS

Felix A Levinzon, Ultra-Low-Noise High-Input Impedance Amplifier for Low-Frequency Measurement Applications, IEEE Transactions on Circuits and Systems—I: Regular Papers . . . .

* cited by examiner

Primary Examiner — Henry Choe

(57) ABSTRACT

A method for low noise signal amplification includes modifying a signal by way of a first amplification stage and conveying the modified signal to a second amplification stage. The method continues with comparing an output of the second amplification stage with a signal ground in a low-frequency feedback loop and changing a bias voltage for the first amplification stage as a result of the comparing step.

9 Claims, 5 Drawing Sheets of signal source 100, which serves to remove any DC bias from the signal

LOW NOISE AMPLIFIER

BACKGROUND

In many amplification and signal processing applications, a premium is placed on preserving the integrity of the signal as the signal undergoes various electronic processes. One of the most significant causes of signal degradation is the introduction of noise, which can be the result of any number of electronic and physical processes. Accordingly, circuit designers are constantly attempting to determine the mechanisms by which noise is coupled into a circuit and techniques for reducing that noise to the lowest possible level within the confines of cost and circuit complexity.

For certain types of electronic circuits, such as those used to amplify outputs from condenser microphones and accelerometers that employ piezoelectric or Micro Electro-Mechanical Systems technology, reducing the level of noise coupled into and generated by the various circuit elements can be especially problematic. In these instances, the signal source may have a large output impedance which can cause the output signal to be particularly susceptible to the introduction of noise brought about by the loading effects of subsequent signal processing circuitry. Accordingly, designing and building circuits that can receive and process these types of signals is a continued area of investigation.

BRIEF DESCRIPTION OF THE DRAWINGS

FIG. 3.

DESCRIPTION OF THE EMBODIMENTS

Embodiments of the invention provide low noise amplification of signals received from sensors having relatively high output impedance (such as condenser microphones, accelerometers using piezoelectric and Micro Electro-Mechanical Systems technologies, and so forth). In one embodiment of the invention, the amplifier requires a single junction field effect transistor, two operational amplifiers, along with a small number passive circuit elements. An embodiment of the amplifier has been simulated and been shown to exhibit very low noise over the range of 10 kHz to 100 kHz. The simulations also indicate that embodiments of the invention can have wide frequency response as well as low power consumption.

Figure 1:
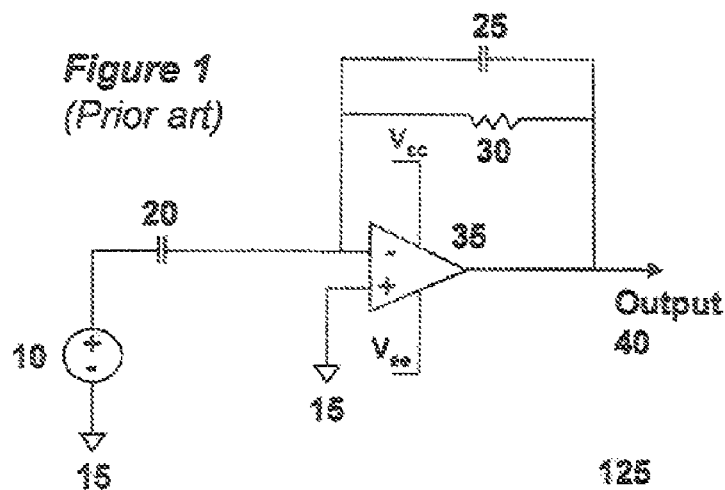
FIG. 1 shows a charge amplifier according to the prior art.

FIG. 1 shows a charge amplifier according to the prior art. In FIG. 1, a sensor having a high output impedance is modeled as signal source 10 having signal ground 15. The signal from signal source 10 is passed through capacitor 20 (100 pF), which serves to remove any DC bias from the signal source. The signal is then conveyed to the inverting input of operational amplifier 35 which operates as a summing junction in which the noninverting input is tied to signal ground 15. Operational amplifier 35 may be an LT1113 (manufactured by the Linear Technology Co. located at 720 Sycamore Drive, Milpitas, Calif.) or other suitable device having high input impedance and noise performance of on the order of less than 5.0 nV/√Hz at 50 kHz. When the charge amplifier of FIG. 1 is operating, most of the current sampled from output 40 is conveyed through feedback capacitor 25 (10 pF). Feedback resistor 30 (20 Meg Ohm) provides DC feedback which ensures that at least a small amount of current is allowed to return to ground, thus keeping the output voltage of operational amplifier 35 from excessive DC offset.

Figure 2:
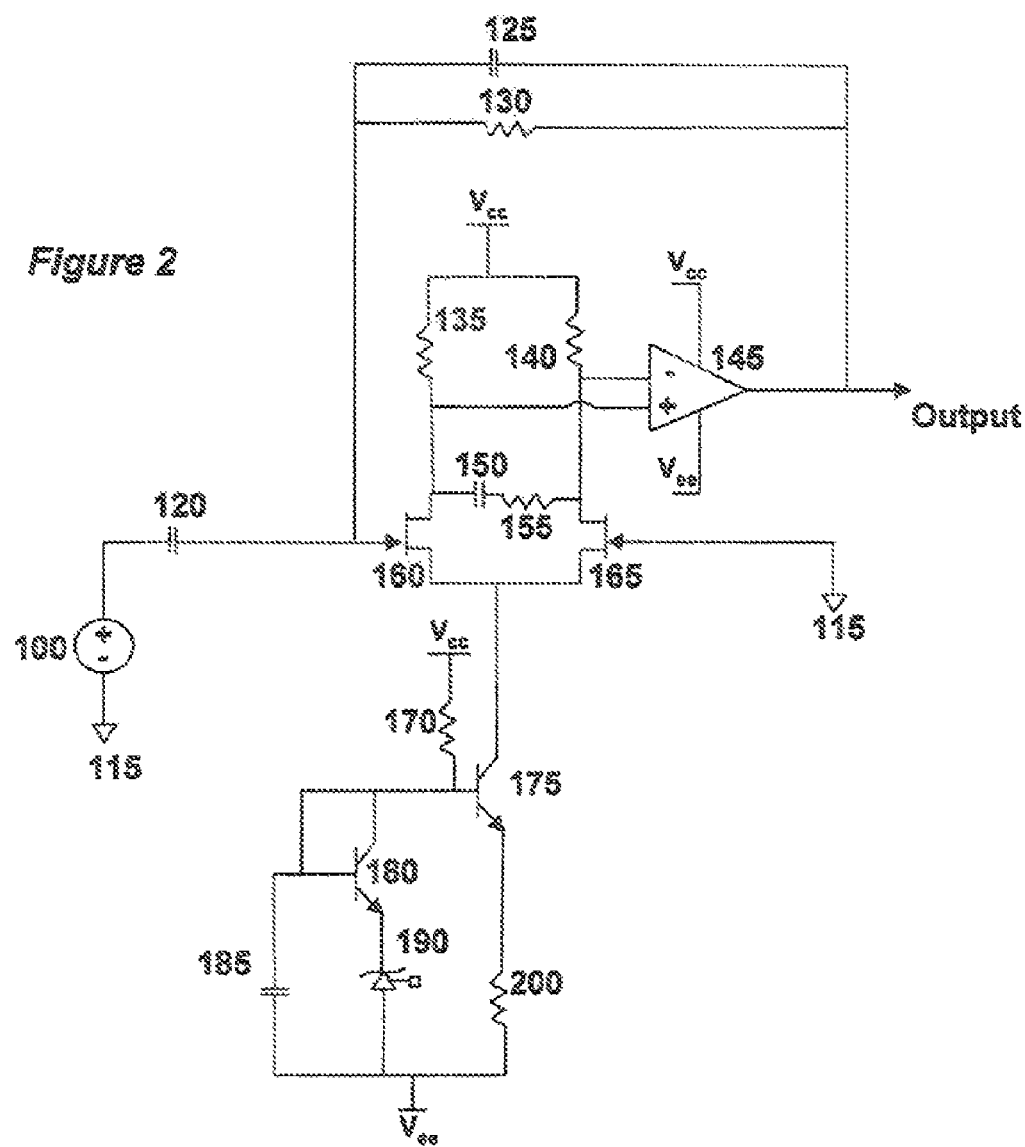
FIG. 2 shows a charge amplifier having improved performance over the circuit of FIG. 1.

FIG. 2 shows a charge amplifier having improved performance over the circuit of FIG. 1. In FIG. 2, a sensor having a high output impedance is modeled as signal source 100 having signal ground 115. The signal from signal source 100 is passed through capacitor 120 (100 pF) and then to the gate of junction field effect transistor 160, which along with junction field effect transistor 165, operates as a differential amplifier. In one embodiment of the invention, transistors 160 and 165 represent a low noise monolithic n-channel differential amplifier such as the LSK389A (available from Linear Integrated systems at 4042 Clipper Court, Fremont, Calif. 94538).

The combination of resistor 170 (10 Kilo Ohm), bipolar junction transistor 175, bipolar junction transistor 180, capacitor 185 (1 μF), Zener diode 190, and resistor 200 (600 ohm) function as a stable 4 milliampere current source that biases the differential amplifier formed by transistors 160 and 165. In one embodiment of the invention, transistors 175 and 180 are 2N2222 transistors (supplied by Fairchild Semiconductor at Fairchild Semiconductor Corporation 3030 Orchard Parkway, San Jose, Calif. 95134). Zener diode 190 may be an LT1009 (available from Linear Technology at 1630 McCarthy Blvd., Milpitas, Calif. 95035.)

Coupled to the drains of transistors 160 and 165 are resistors 135 and 140 (both 750 ohms), capacitor 150 (1 nF), and resistor 155 (2 kilo Ohm). These circuit elements have the effect of decreasing the gain at the output of the differential amplifier (transistors 160 and 165) as the frequency of signal source 100 is increased. In this embodiment at low frequencies, capacitor 150 approaches an open circuit. Consequently, the gain of the differential amplifier is determined by resistors 135 and 140. Continuing with this example at high frequencies, capacitor 150 approaches a short-circuit which reduces the differential amplifier gain as a larger portion of the output current is shunted through capacitor 150 and resistor 155. In at least one embodiment of the invention, these circuit elements reduce the differential amplifier gain prior to reaching the loop gain crossover point of the two-stage amplifier brought about by amplifier 145 with feedback capacitor 125 (10 pF) and resistor 130 (20 Meg ohms).

The effect of the differential amplifier formed by transistors 160 and 165 is to present a high impedance input to the signal from signal source 100. This first stage of amplification provides sufficient signal gain so as to overcome a large fraction of the input noise of the second amplification stage brought about by operational amplifier 145. This allows the output of operational amplifier 145 to include less noise than the charge amplifier configuration of the embodiment of FIG. 1. In the embodiment of FIG. 2, operational amplifier 145 may be an LT6234, also available from Linear Technology mentioned hereinabove.

In FIG. 2, it can be seen that the sole purpose of transistor 165 is to sense the potential of ground 115 and thus provide stability for the differential amplifier at DC. Thus, although two active noise sources are present in the first amplification stage of FIG. 2 (transistors 160 and 165), transistor 165 assumes a very limited role in the low noise amplification process. Further, given that in order to perform as a low noise differential amplifier, transistors 160 and 165 must be closely matched at DC, typically within 10 mV of each other over a wide range of gate-to-source voltages, the cost of the two-stage amplifier of FIG. 2 can be excessive. This can be especially troublesome in applications for which a large number of low noise amplifiers are required.

Figure 3:
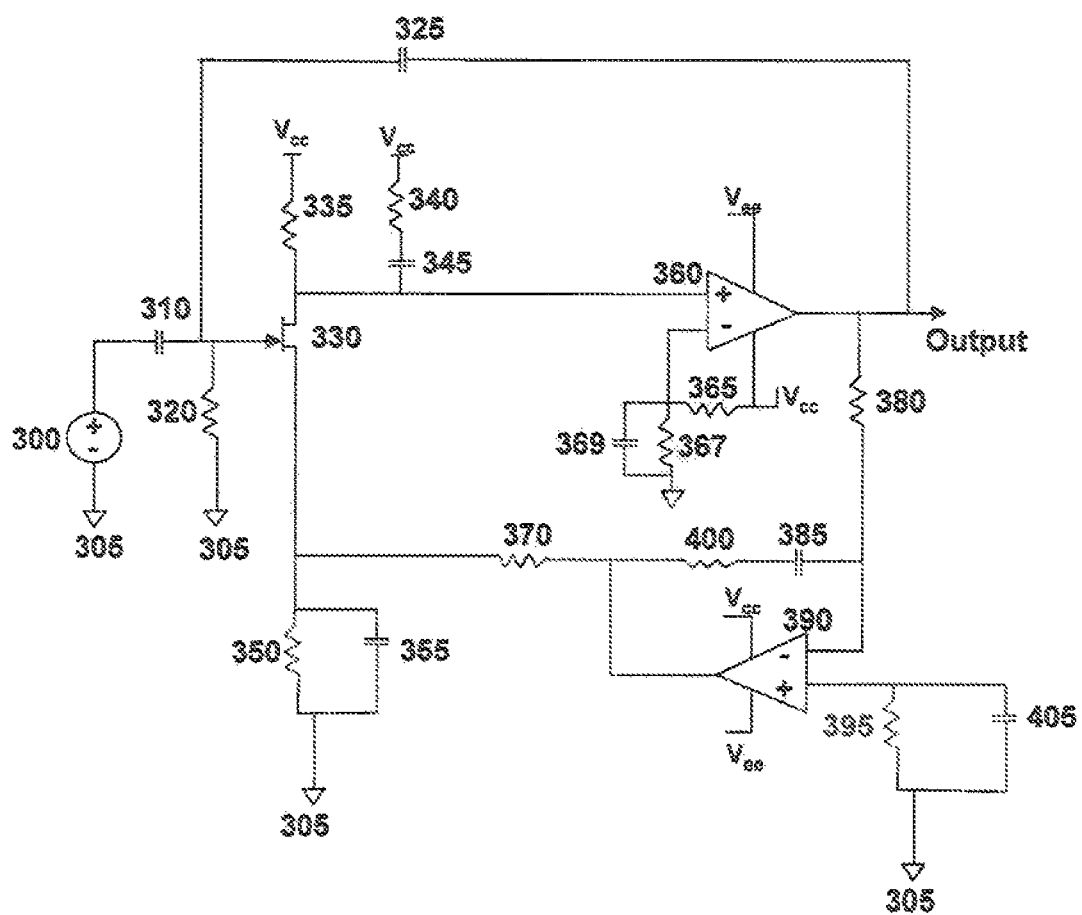
FIG. 3 shows a low noise amplifier according to an embodiment of the invention.

FIG. 3 shows a low noise amplifier according to an embodiment of the invention. In FIG. 3, a single transistor (330) is employed, thus eliminating the second transistor as used in the amplifier of FIG. 2. Additionally, as only one transistor is used in FIG. 3, the need for costly matching of transistors is also eliminated. When simulated, the amplifier has been shown to exhibit very low noise over the range of 10 kHz to 100 kHz. The simulations also indicate that embodiments of the invention can have wide frequency response as well as low power consumption. (See FIGS. 6 and 7 herein.)

In FIG. 3, a sensor having high output impedance is represented by signal source 300 having signal ground 305. Capacitor 310 provides AC coupling to the signal source and substantially eliminates DC bias voltages that might be present at the output of signal source 300. In the embodiment of FIG. 3, one end of resistor 320 (20 Meg Ohm) is coupled to the gate of transistor 330 with the other end being coupled to signal ground 305. Transistor 330 represents a low noise junction field effect transistor whose function is to amplify the AC coupled input so as to overcome a large fraction of the input noise of the second amplification stage brought about by operational amplifier 360. In a manner similar (though not identical) to that of FIG. 2, resistor 335 (750 ohms), resistor 340 (500 ohms), and capacitor 345 (1 nF) function to provide more gain at lower frequencies than at higher frequencies. Operational amplifier 360 receives a divided down version of $V_{cc}$ which is reduced by way of resistor divider network 365 and 367. Capacitor 369 serves to remove high-frequency noise caused by the resistor divider from the input of operational amplifier 360.

Operational amplifier 360, which may be an LT6234 as previously identified with reference to FIG. 2, receives an input from transistor 330. The output of operational amplifier 360 is coupled to the input of operational amplifier 390 by way of resistor 380 (10 kilo Ohm). Operational amplifier 390 is configured as an integrator using resistor 400 (250 ohm) in series with capacitor 385 (2.2 pF). This has the effect of creating a low-frequency loop consisting of transistor 330, operational amplifier 360, resistor 380, operational amplifier 390, and resistor 370 (500 ohms). In this embodiment, the output of operational amplifier 360 is sampled and compared with a ground signal from signal ground 305.

The resulting error signal, which possesses a large DC component that results from the integration process, is then used to adjust the source voltage of transistor 330. The adjustment of the bias applied to the source of transistor 330 maintains a voltage approximately equal to the voltage between resistors 365 and 367 at the drain of transistor 330 independent of the transistor's operating parameters. At the noninverting input of amplifier 390, resistor 395 (10 kilo Ohm) provides a DC path to ground 305, and capacitor 405 (0.1 pF) provides AC bypassing to ground 305. In a similar manner, resistor 350 (1.5 kilo Ohm) and capacitor 355 (1 pF) provide a ground path for DC and high-frequency components of the output of amplifier 390.

Figure 4:
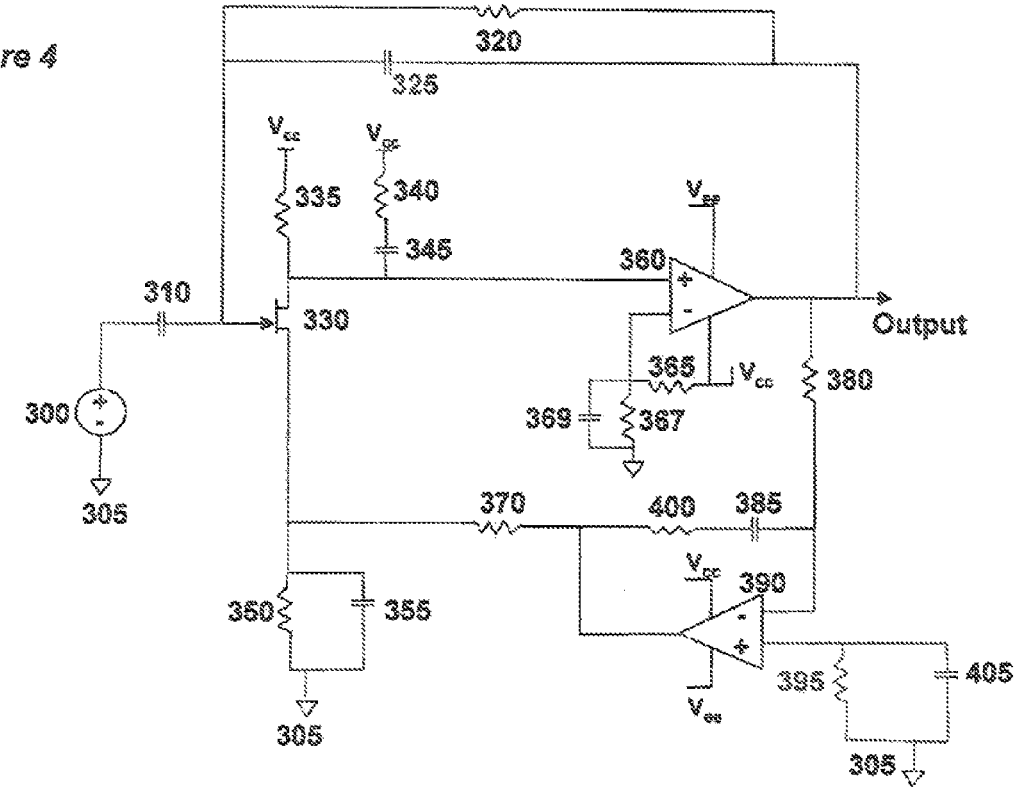
FIG. 4 shows a low noise amplifier according to another embodiment of the invention.

The inventor has determined that a high-frequency loop is present from operational amplifier 360 and through feedback capacitor 325 (10 pF). It should be noted that resistor 320 (20 Meg ohms) may be connected from the gate of transistor 330 to ground 305 to improve low-frequency response. In other embodiments of the invention, such as that of FIG. 4, resistor 320 may be configured in parallel with feedback capacitor 325 as opposed to being connected to signal ground 305 to improve low-frequency noise performance.

Figure 5:
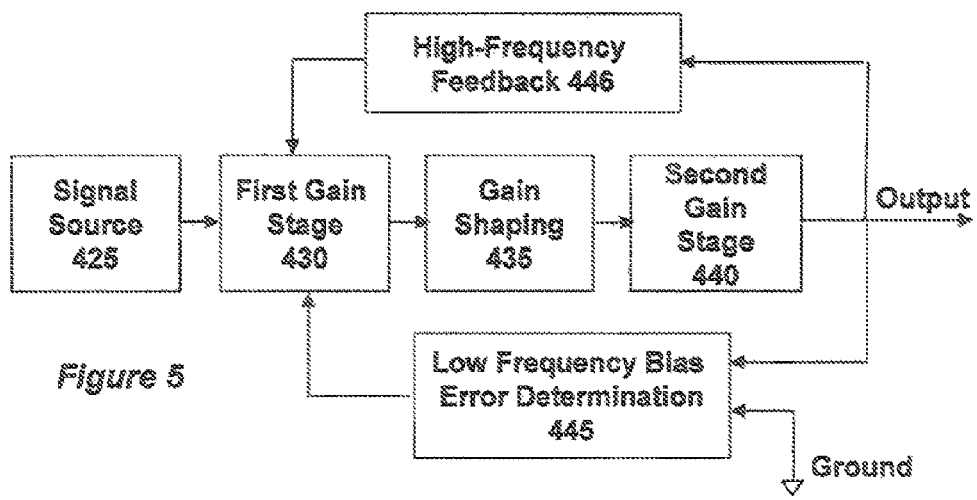
FIG. 5 is a block diagram showing the major components of shows a low noise amplifier according to another embodiment of the invention.

FIG. 5 is a block diagram of a low noise amplifier according to another embodiment of the invention. In FIG. 5, signal source 425 represents a high impedance output of a sensor. At first gain stage 430, the signal from source 425 is modified (amplified) by way of a low noise junction field effect transistor or by way of another suitable amplification method. At gain shaping module 435, the output of first gain stage 430 is reduced as a function of the signal frequency. At low frequencies, little or no gain reduction is performed. At higher frequencies, more substantial gain reduction is performed. The gain-reduced signal is then conveyed to second gain stage 440 and output. An output of second gain stage 440 is conveyed to high frequency module 446. The output of module 446 includes a large high frequency component used for high frequency loop stabilization. Another output of second gain stage 440 is conveyed to low-frequency bias error determination module 445. The output of module 445, which includes a large DC component, is then used to adjust the DC offset of first gain stage 430.

Figure 6:
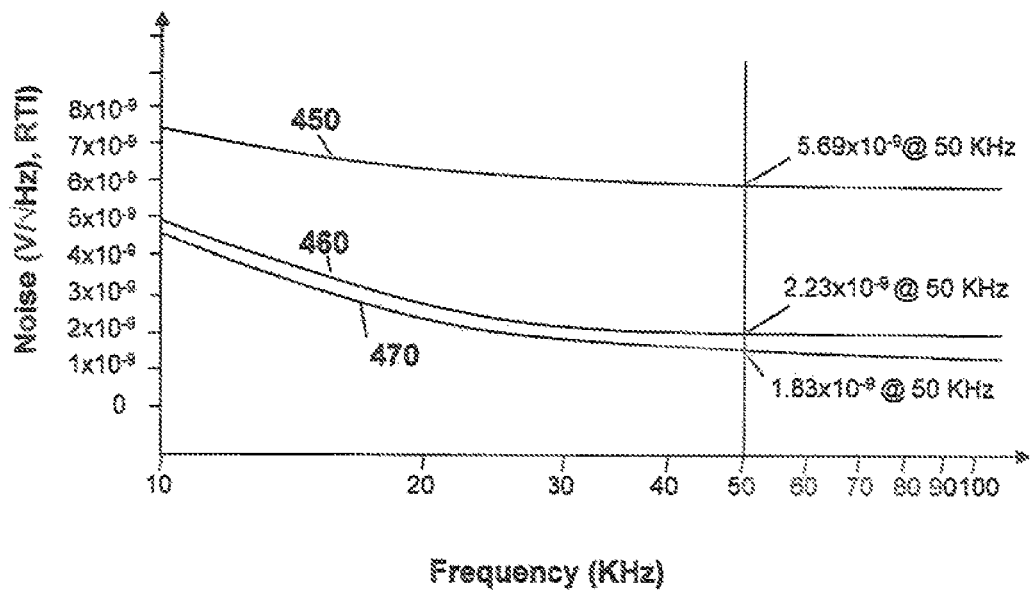
FIG. 6 is a plot showing relative noise performance of the circuits of FIG. 1, FIG. 2, and FIG. 3.

FIG. 6 is a plot showing relative noise performance of the circuits of FIG. 1, FIG. 2, and FIG. 3. In FIG. 6, the top curve (450) shows the noise performance in V/√Hz, referred to input (RTI) for the circuit of FIG. 1 indicating that at a 50 kHz operating frequency, the noise of the circuit of FIG. 1 is approximately $5.69 \times 10^{-9}$ V/√Hz. For the circuit of FIG. 2, the middle curve (460) indicates improved noise performance showing of $2.23 \times 10^{-9}$ V/√Hz at 50 kHz. For the circuit of FIG. 3, the bottom curve (470) indicates further improved noise performance of $1.83 \times 10^{-9}$ V/√Hz at 50 kHz.

Figure 7:
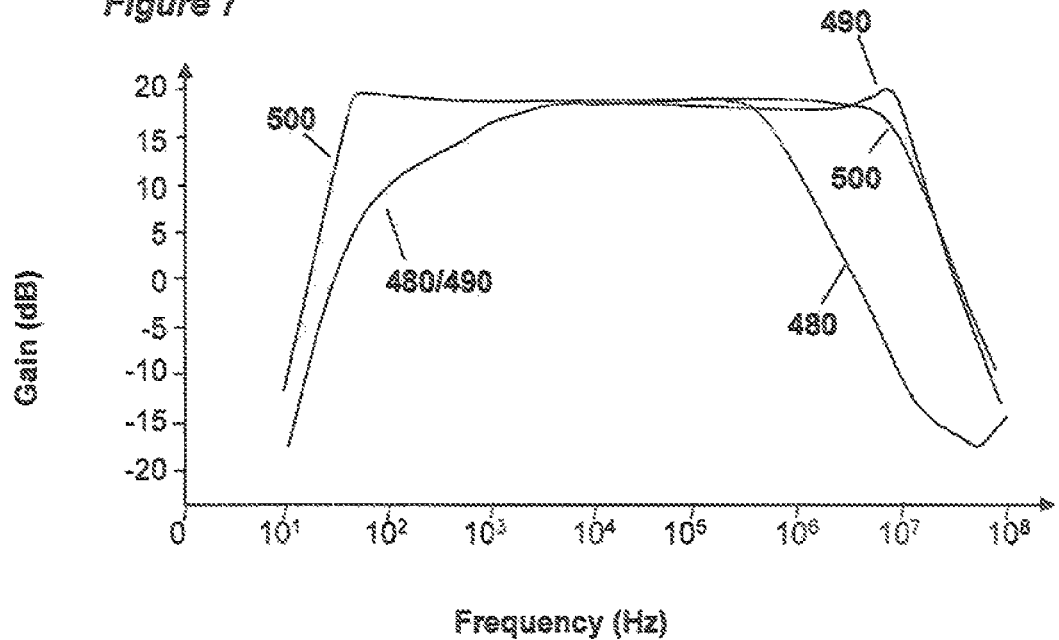
FIG. 7 is a plot showing the relative frequency response of the circuits of FIG. 1, FIG. 2.

FIG. 7 is a plot showing the relative frequency response of the circuits of FIG. 1, FIG. 2, and FIG. 3. In FIG. 7, gain curves 480 and 490 show the frequency response of the charge amplifier of FIGS. 1 and 2, respectively, with the gain profiles being identical at low-frequency. For the circuits of FIG. 1 and FIG. 2, the gain begins to level off to a maximum value at approximately 1 kHz. It should be noted that at higher frequencies, the roll off in performance of the charge amplifier of FIG. 1 (curve 480) begins well before $10^6$ Hz (1 MHz). It should also be noted that the gain of the charge amplifier of FIG. 1 assumes a value of 0 dB shortly above a frequency of approximately $2 \times 10^6$ Hz (2 MHz).

Curve 490 of FIG. 7 shows the frequency response of the low noise amplifier circuit of FIG. 2. As previously mentioned, the low-frequency gain is identical to that of the circuit of FIG. 1 and begins to level off at a maximum value around 1 kHz. At approximately $10^7$ Hz (10 MHz) it can be seen that gain curve 490 peaks at roughly 21 dB before crossing below 0 dB at approximately $5 \times 10^7$ Hz (50 MHz).

Finally, curve 500 of FIG. 7 shows the frequency response of the low noise amplifier circuit of FIG. 3. Note the favorable low-frequency response of curve 500 in which the amplifier begins to produce gain at a frequency of approximately 20 Hz. The gain is substantially flat until approximately $10^7$ Hz (10 MHz), approaching a gain of 0 dB at approximately $5 \times 10^7$ Hz (50 MHz).

Figure 8:
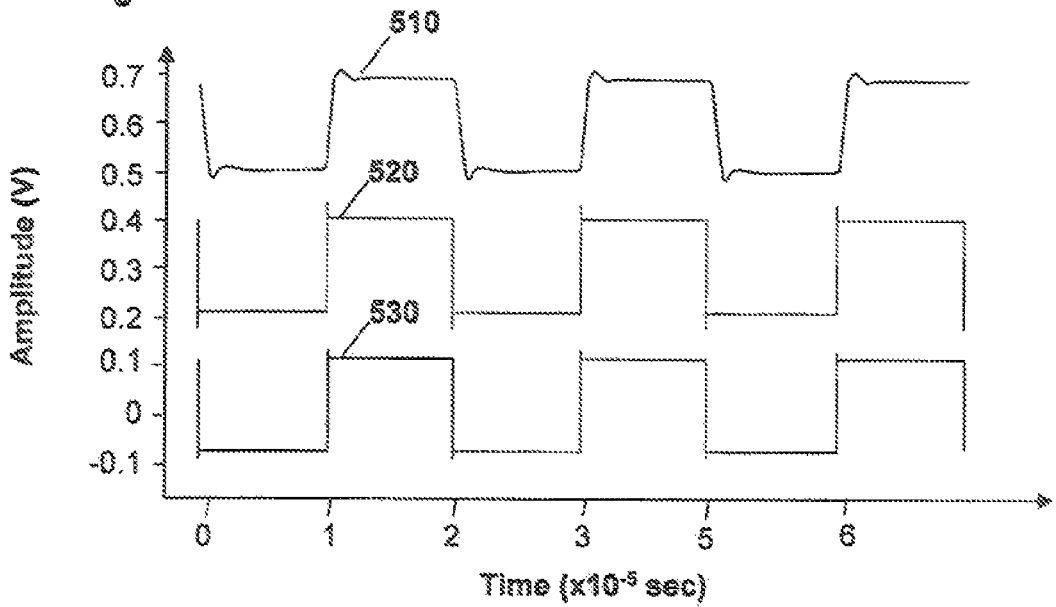
FIG. 8 shows the waveform response of the low noise amplifier circuits of FIG. 1, FIG. 2, and FIG. 3.

FIG. 8 shows the waveform response of the low noise amplifier circuits of FIG. 1, FIG. 2, and FIG. 3. In each instance, a square wave has been introduced at the input to each circuit and the output measured in curves 510, 520, and 530. Curves at 510 and 520 have been offset from curve 530 by a DC amount so that each waveform can make use of a single timescale on the horizontal axis.

In curve 510, which corresponds to the output waveform of the charge amplifier of FIG. 1, it can be seen that the amplifier overshoots in both the positive and negative directions in response to an input square wave. Additionally, note the relatively slow rise and fall times. In contrast, curve 520, which corresponds to the output waveform of the circuit of FIG. 2, the rise and fall times are steeper than those of curve 510. However, curve 520 also exhibits overshoot in both of the positive and negative directions. In curve 530, which corresponds to the output waveform of the circuit of FIG. 3, the rise and fall times are as steep those of curve 520. However, the curve 530 exhibits very little overshoot in either the positive or negative directions.

Figure 9:
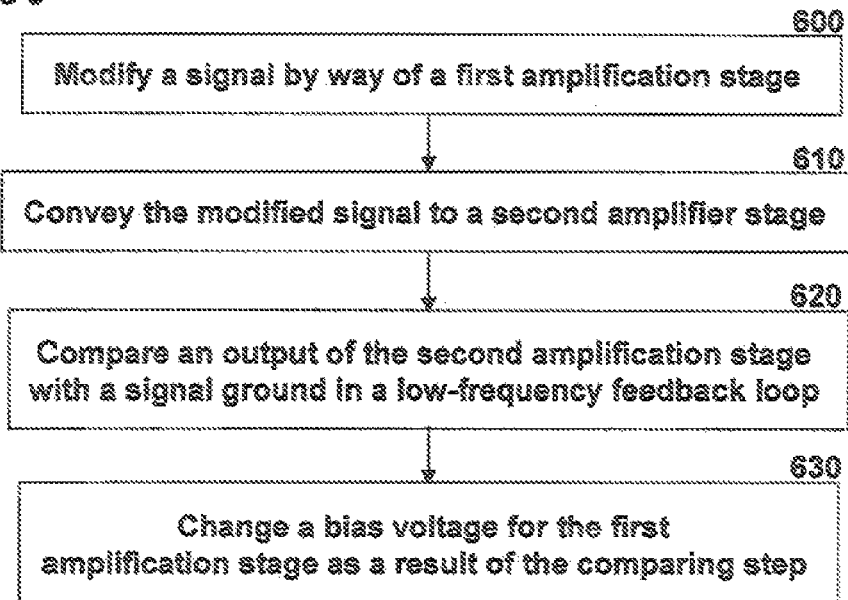
FIG. 9 is a flow chart for a method for low noise signal amplification according to an embodiment of the invention.

FIG. 9 is a flow chart for a method for low noise signal amplification according to an embodiment of the invention. The method of FIG. 9 may be practiced using the circuit of FIG. 3, although nothing prevents the use of alternative structures to perform the method. The method of FIG. 9 begins at step 600 in which a received signal is modified by way of a first amplification stage. The method continues at step 610 in which the modified signal is conveyed to a second amplifier stage. Step 610 may include altering the gain as a function of the frequency of the modified signal, such as, for example using a resistor and capacitor combination that lowers the gain of a second amplifier stage as the frequency increases. The method continues at step 620 in which the output of a second amplification stage is compared with a signal ground in a low-frequency feedback loop. Step 620 may include the use of an integrator in the low-frequency feedback loop. The method continues at step 630 in which the bias voltage for the first amplification stage is changed as a result of the comparing step (as in step 620).

In conclusion, while the present invention has been particularly shown and described with reference to various embodiments, those skilled in the art will understand that many variations may be made therein without departing from the spirit and scope of the invention as defined in the following claims. This description of the invention should be understood to include the novel and non-obvious combinations of elements described herein, and claims may be presented in this or a later application to any novel and non-obvious combination of these elements. The foregoing embodiments are illustrative, and no single feature or element is essential to all possible combinations that may be claimed in this or a later application. Where the claims recite "a" or "a first" element or the equivalent thereof, such claims should be understood to include incorporation of one or more such elements, neither requiring nor excluding two or more such elements.

What is claimed is:

1. A method for low noise signal amplification, comprising:
    modifying a signal by way of a first amplification stage;
    conveying the modified signal to a second amplification stage;
    coupling an output of the second amplification stage with an input to the first amplification stage by way of a high-frequency loop, the high-frequency loop including either a capacitor or a parallel combination of a resistor and a capacitor;
    comparing an output of the second amplification stage with a signal ground in a low-frequency feedback loop, the low-frequency feedback loop including an integrator configured to sample an output of the second amplification stage; and
    changing a bias voltage for the first amplification stage as a result of the comparing step.

2. The method of claim 1, wherein the changing step further comprises injecting a low-frequency error signal into the source of a junction field effect transistor.

3. The method of claim 1, wherein the conveying step includes reducing the gain of the first amplification stage as a function of the frequency of the signal.

4. The method of claim 3, wherein the reducing step includes lowering the gain of the first amplification stage as the frequency of the signal increases.

5. A low noise amplifier, comprising;
    a first amplification stage;
    a second amplification stage coupled to the output of the first amplification stage;
    a low-frequency loop that integrates the output of the second amplification stage to form a low-frequency error signal, wherein the low-frequency error signal influences a bias voltage of the first amplification stage; and
    a high-frequency loop that couples an output of the second amplification stage with an input to the first amplification stage, the high-frequency loop including one of the group consisting of a capacitor and a parallel combination of a resistor and a capacitor.

6. The low noise amplifier of claim 5, wherein an input to the second amplification stage includes circuit elements that reduce the gain of the first amplification stage.

7. The low noise amplifier of claim 5, wherein the low-frequency error signal is injected to the source of a junction field effect transistor.

8. The low noise amplifier of claim 5, wherein the low-frequency loop includes an operational amplifier that compares an output of the second amplification stage to a signal ground.

9. The low noise amplifier of claim 8, additionally comprising a resistor and capacitor network for filtering high-frequency components from the input of the operational amplifier.

* * * * *